US006379161B1

United States Patent
Ma

(10) Patent No.: US 6,379,161 B1
(45) Date of Patent: Apr. 30, 2002

(54) METHOD OF MAKING AN ELECTRICAL CONNECTOR

(75) Inventor: Hao-Yun Ma, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/755,396

(22) Filed: Jan. 3, 2001

(30) Foreign Application Priority Data

Dec. 5, 2000 (TW) .......................................... 89125921

(51) Int. Cl.[7] .............................................. H01R 12/00
(52) U.S. Cl. ............................ 439/83; 439/886; 29/884; 29/885; 29/860
(58) Field of Search .......................... 29/848, 860, 843, 29/884, 885; 439/83, 876, 885, 886

(56) References Cited

U.S. PATENT DOCUMENTS

| 5,667,393 A | * | 9/1997 | Grabbe et al. ................. 439/83 |
| 5,779,507 A | * | 7/1998 | Yeh .............................. 439/885 |
| 5,823,801 A | * | 10/1998 | Elkhatib ....................... 439/83 |
| 6,113,438 A | * | 9/2000 | O'Sullivan ................... 439/885 |

* cited by examiner

*Primary Examiner*—Gary Paumen
(74) *Attorney, Agent, or Firm*—Wei Te Chung

(57) ABSTRACT

A method of making an electrical connector includes the steps of: a. stamping and forming a contact strip (10) and a number of contacts (12) on the contact strip; b. defining a recess (16) in a tail (14) of each contact; c. applying a first finish of nickel material on portions of the contact having the recesses followed by a second finish of tin-lead alloy material; d. injection molding an insulative housing (20) to the contacts; e. bending the tails outwardly; f. severing the contact strip from the contacts at the recesses.

1 Claim, 8 Drawing Sheets

METHOD OF MAKING AN ELECTRICAL CONNECTOR

BACKGROUND OF THE INVENTION

1. Field of the Invention

The present invention relates to a method of making an electrical connector, and particularly to a method including at least a step of forming a portion having a recess at a tail of each contact and a step of applying a finish of conductive material on the portions having the recesses.

2. Description of the Related Art

A conventional method of making an electrical connector typically includes the following steps: a. stamping a metal sheet to form a contact strip with a plurality of contacts on the contact strip; b. applying a finish of gold material on contact portions of the contacts; c. forming an insulative housing and engaging the contacts with the housing; d. severing the contact strip from the contacts.

However, in the above conventional method, the tails of the contacts are not well enough designed and manufactured and the tails of the completed connector do not adhere well to soldering tin on circuit pads of a printed circuit board, so the mated connector on the printed circuit board is not very secure and reliable.

Hence, an improved electrical connector is required to overcome the disadvantages of the prior art.

SUMMARY OF THE INVENTION

An object of the present invention is to provide a method of making an electrical connector which can be securely and reliably mounted onto a printed circuit board.

To realize the above object, a method of the present invention comprises steps of:

a. stamping and forming a contact strip with a number of contacts on the contact strip; b. defining a recess in a tail of each contact; c. applying a first finish of nickel material on portions of the contacts having the recesses followed by a second finish of tin-lead alloy material; d. injection molding an insulative housing to the contacts; e. bending the tails outwardly; f. severing the contact strip from the contacts cutting at the recesses.

An advantage of the connector made by the above method is that the tails of the contacts of the connector can bind with more soldering tin than tails of the prior art since the recesses defined at the tails bind with more soldering tin. Therefore, the connector can be more securely and reliably mounted onto a printed circuit board.

Other objects, advantages and novel features of the invention will become more apparent from the following detailed description of the present embodiment when taken in conjunction with the accompanying drawings.

DESCRIPTION OF THE PREFERRED EMBODIMENT

Figure 3:
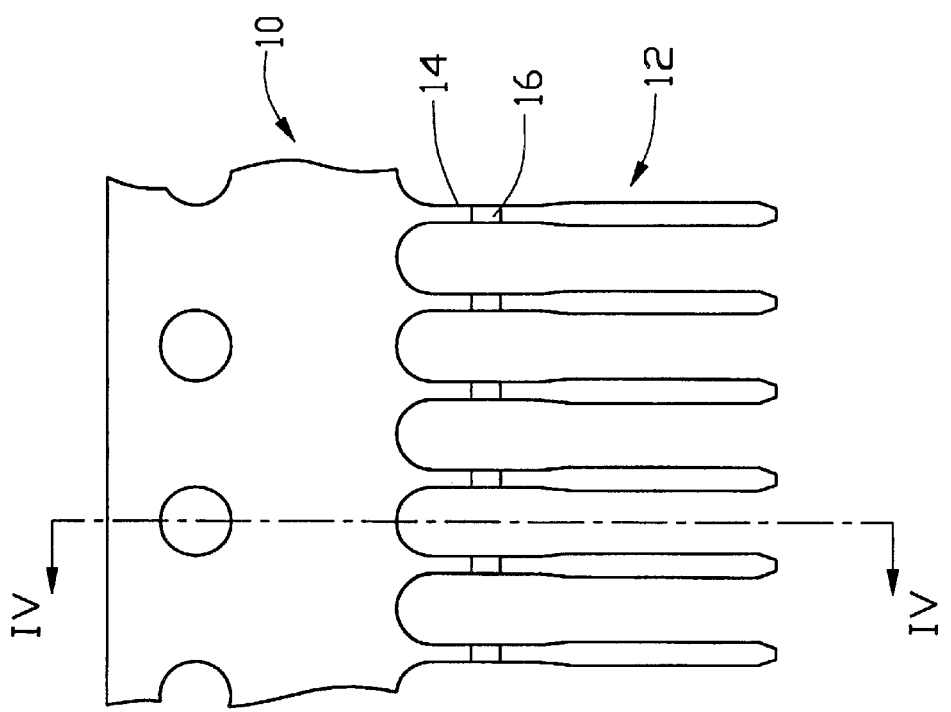
FIG. 3 is similar to FIG. 1 except that a recess is defined in a tail of each contact.
Figure 1:
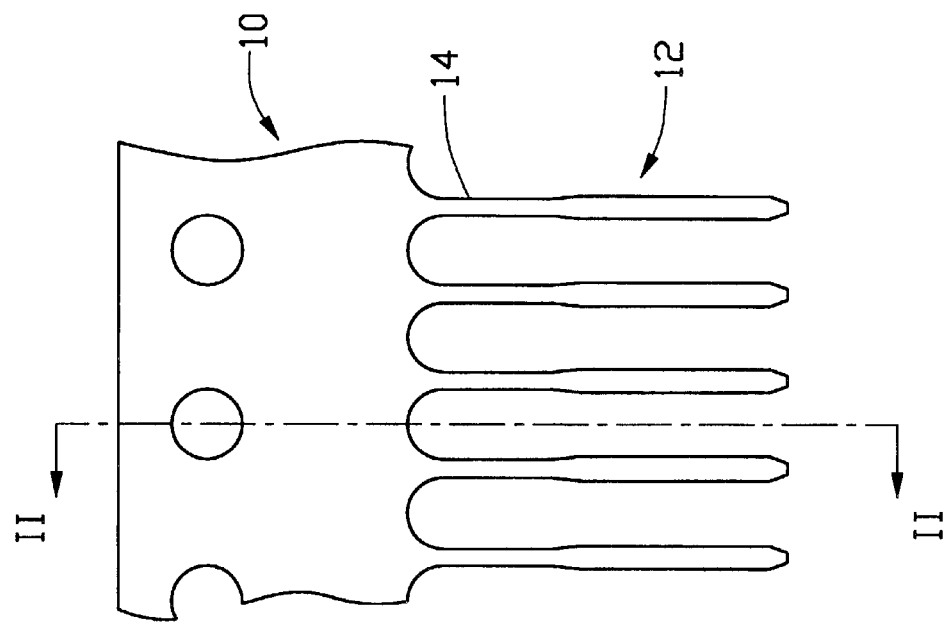
FIG. 1 is a top plan view of a contact strip and a plurality of contacts on the contact strip made by a method of the present invention.
Figure 4:
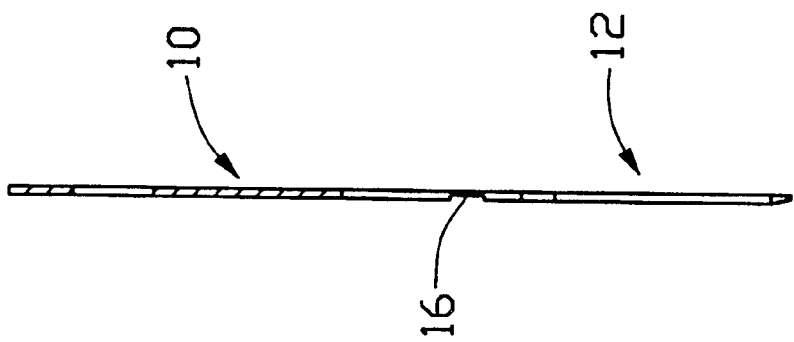
FIG. 4 is a cross-sectional view taken along line IV—IV of FIG. 3.
Figure 2:
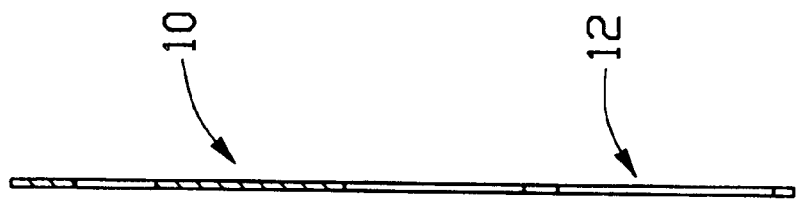
FIG. 2 is a cross-sectional view taken along line II—II of FIG. 1.
Figure 5:
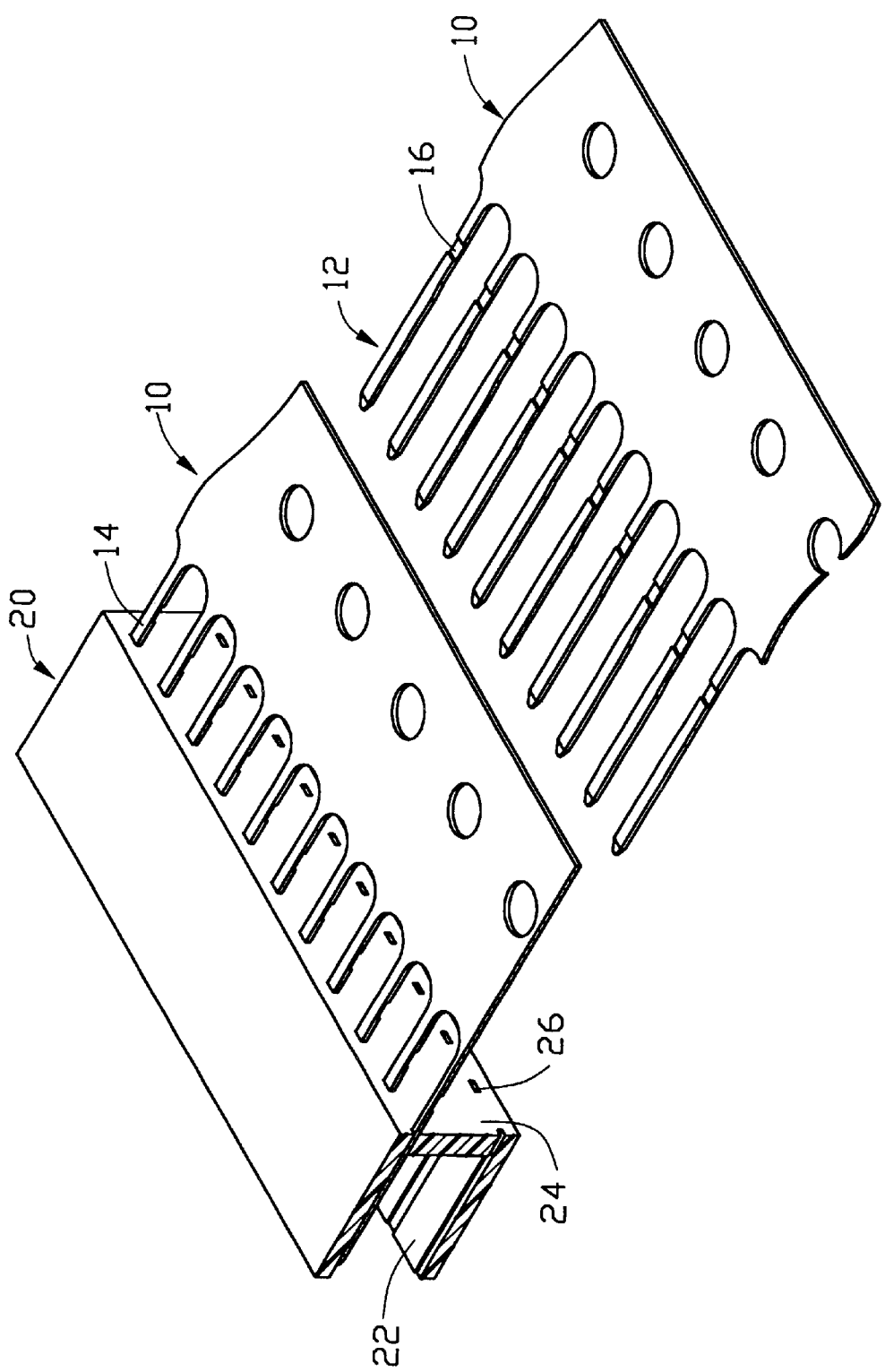
FIG. 5 is a perspective view illustrating the contact strip and a housing with the contacts being inserted into the insulative housing of the present invention, wherein the housing and the contacts with the contact strip are shown in cross-section.
Figure 6:
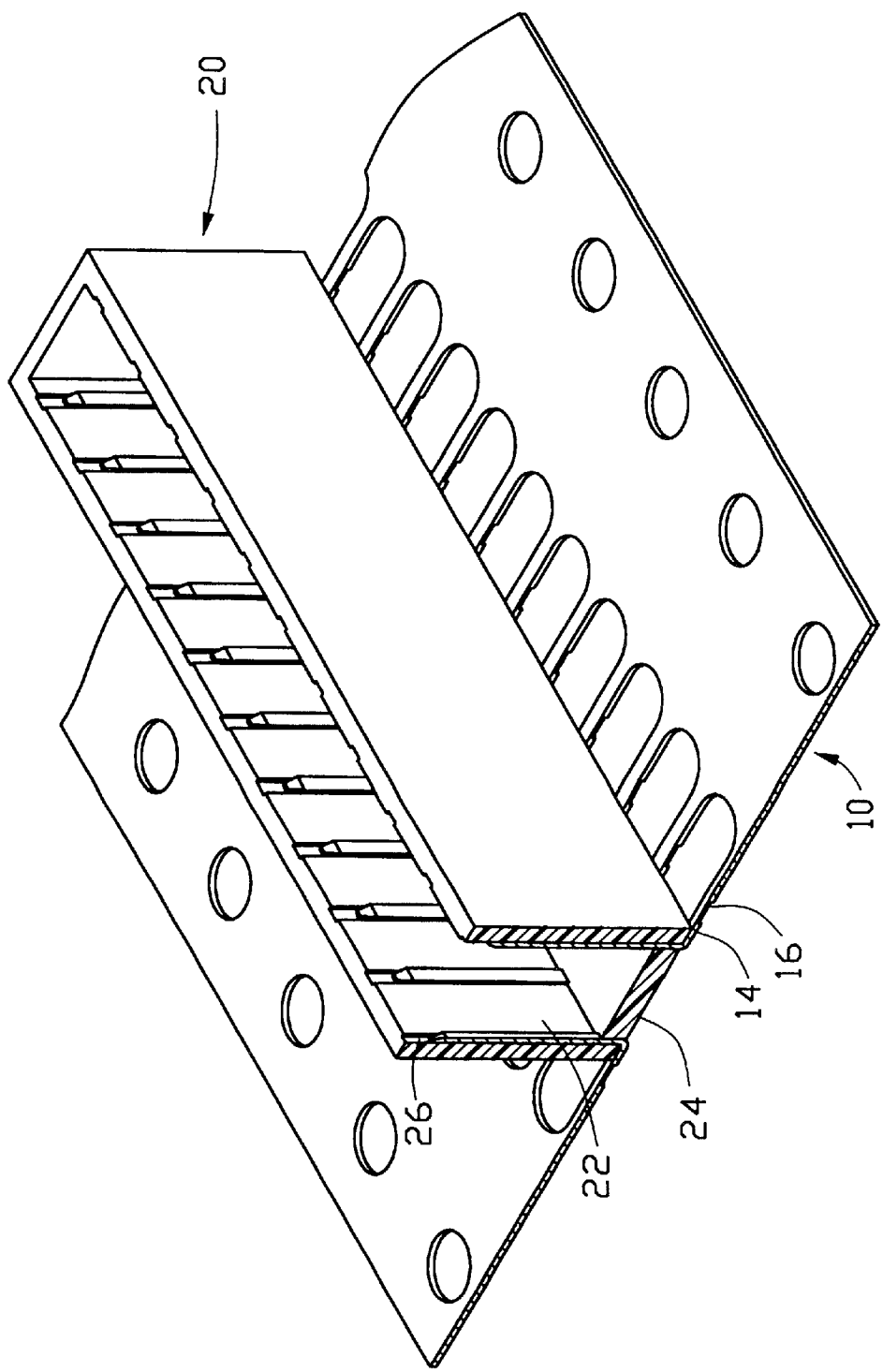
FIG. 6 is an enlarged perspective view of an assembly of the housing and the contacts with the contacts bent, wherein the housing and the contacts with the contact strips are shown in cross-section.
Figure 7:
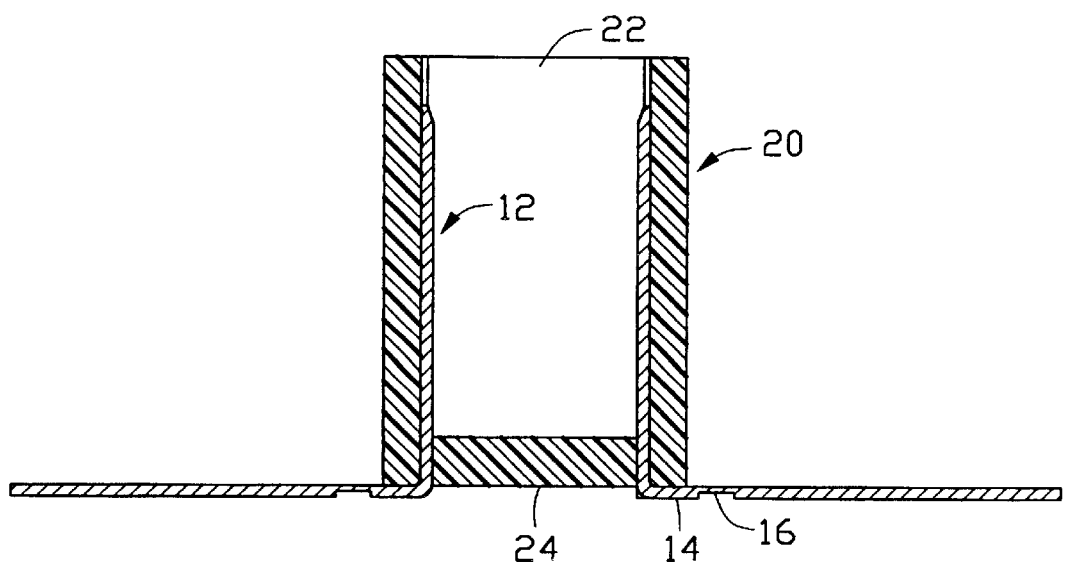
FIG. 7 is a cross-sectioned view of the assembly of FIG. 6.
Figure 8:
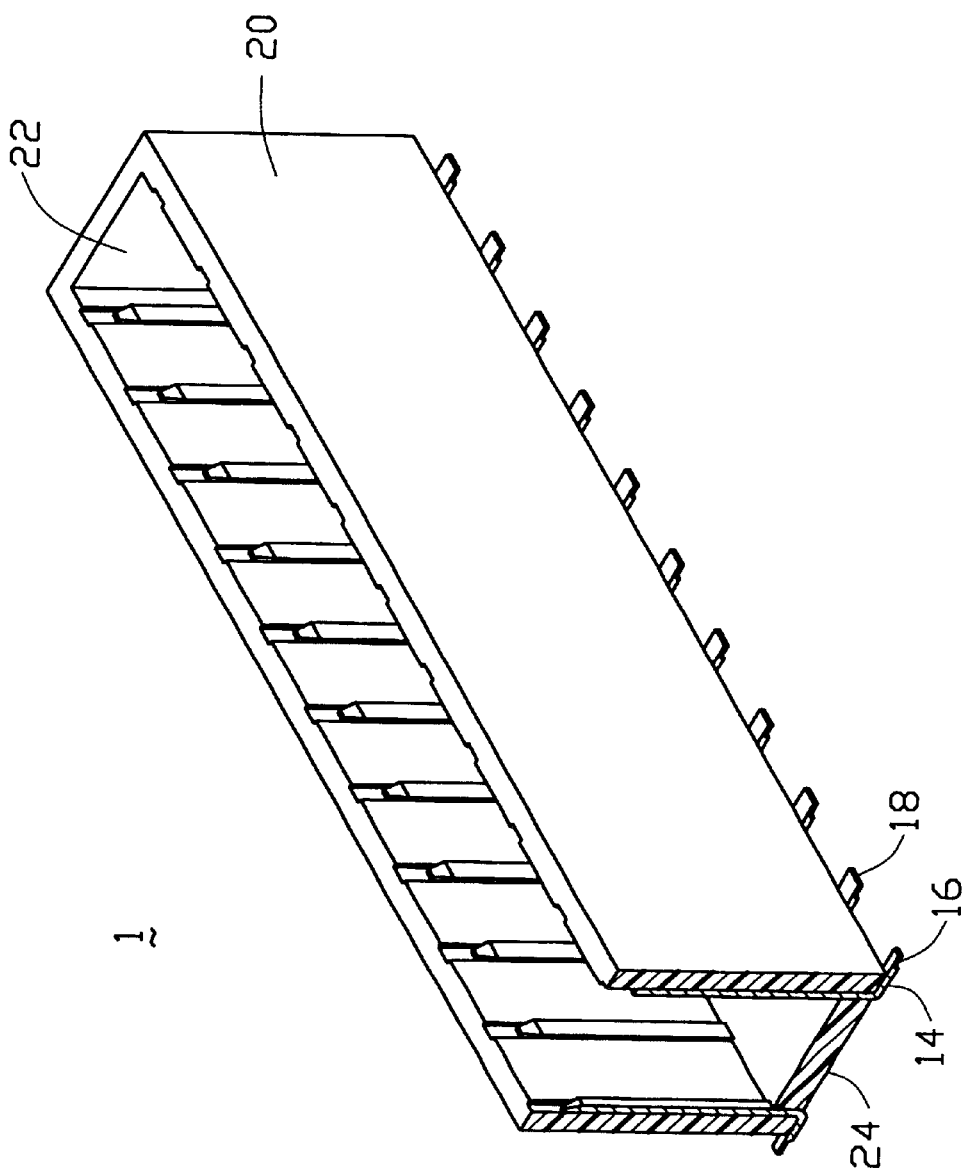
FIG. 8 is similar to FIG. 6, but with the contact strips severed from the contacts.

Referring to FIGS. 1–8, a method of making an electrical connector 1 in accordance with a preferred embodiment of the present invention comprises the steps of: a. forming contacts 12 connected to a contact strip 10; b. defining a recess 16 at a tail 14 of each contact 12; c. applying a finish to the tails 14 of the contacts 12; d. forming an insulative housing 20; e. assembling the contacts 12 in the housing 20; f. bending the tails 14 of the contacts 12; g. severing the contact strips 10 from the contacts 12. The following description will explain the above steps in greater details.

In step a, a metal sheet is fed into a punch machine to form the contact strip 10 and a plurality of the needle-like contacts 12 laterally extending from one side edge of the contact strip 10. The contacts 12 are arranged in a row and are distanced from each other a predetermined distance. The contacts 12 connect to the contact strip 10 via the tails 14 of the contacts 12.

In step b, the contact strip 10 and the contacts 12, while in the punch machine, have the recess 16 punched in the tail 14 of each contact 12. As a result, the portion having the recess 16 is thinner than the other portions of the contacts 12.

In step c, the contact strip 10 and the contacts 12 are dipped in a first plating bath to apply a first finish of nickel material on the tails 14, particularly on the portions of the tails having the recesses 16. The contact strip 10 and contacts 12 are subsequently dipped in a second plating bath to apply a second finish of tin-lead alloy material on the portions covered by the first finish in the first plating bath.

In step d, melted thermoplastic material, for example PVC material, is injected into a mold to form an insulative housing 20. The housing 20 defines a slot 22 for matably receiving a mating electrical connector or electronic component (not shown) therein. The housing 20 further defines a plurality of contact receiving cavities 26 penetrating a bottom surface 24 of the housing 20 and communicating with a periphery of the slot 22.

In step e, two rows of the contacts 12 each on a contact strip 10 are inserted into the cavities 26 of the housing 20. The contact strips 10 and the tails 14 of the contacts are displayed out of the bottom surface 24 of the housing 20. The recesses 16 in the tails 14 of the two rows of contacts 12 confront each other.

In step f, the portions of the contacts 12 protruding from the bottom surface 24 of the housing 20 are bent in opposite outward directions to abut against the bottom surface 24. At this moment, the recesses 16 face downwardly with respect to the housing 20.

In step g, the contact strip 10 is severed from the contacts 12 at the recesses 16. The tails 14 still retain the recesses 16 and the cross-section at the cut 18 of each contact 12 is thinner than the cross-section of the tail 14 inward from the recess 16 of the corresponding contact 12.

In addition to the steps described above, the method of the present invention may further include a step of trimming mating portions of the contacts 12 for mating with a mating connector and a step of applying a finish of a ductile material having good-conductivity, such as gold, to the mating portions. Such steps are well known in the art, so a detailed description is not included here.

Figure 10:
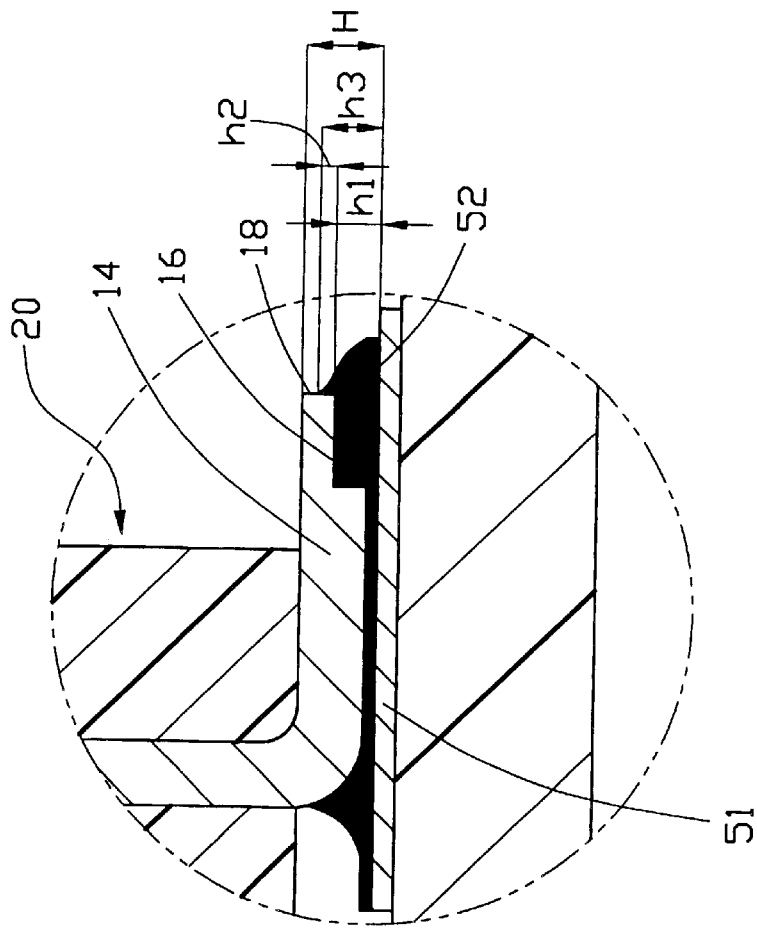
FIG. 10 is an enlarged view of the circled portion in FIG. 9.
Figure 9:
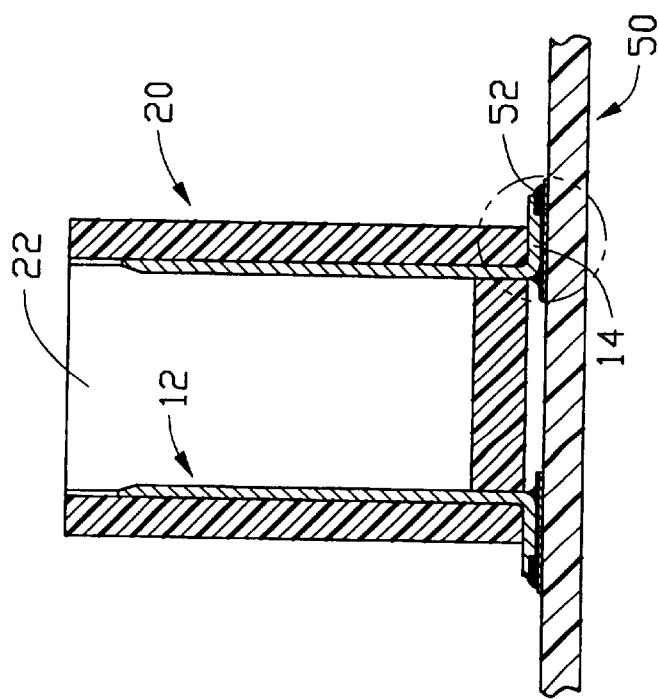
FIG. 9 is a cross-sectional view of the connector of FIG. 8 mounted to a printed circuit board (PCB)

Referring to FIGS. 9 & 10, when mounting the connector 1 to a printed circuit board 50 (PCB), the tails 14 of the contacts 12 are positioned on soldering tin 52 printed on solder pads 51 of the PCB 50. The connector 1 together with the PCB 50 is subsequently fed through an oven to melt the soldering tin 52. Since the recesses 16 of the tail 14 of each contact 12 are plated with a tin-lead alloy material, which has a strong tendency to combine with the soldering tin, the melted soldering tin easily flows into the recesses 16. After solidifying, the soldering tin forms a first mass having a height of h1. In addition, the melted soldering tin rises a predetermined height along the cut 18 due to surface tension/capillary effect and forms a second mass having a height of h2 after solidifying. Therefore, each cut 18 is masked by the first and the second masses, which have a total height h3 equal to the sum of h1 and h2. The height h2 is mainly determined by the material of the soldering tin 52 and the material of the bare contact 12, so h2 is the same as in the prior art. Therefore, the height h1 describes extra solder mass compared with that of the conventional contact. Hence, the height h3 of the soldering tin 52 covering the end of each of the contacts 12 is more likely to exceed half the thickness H of the contact, thereby meeting the standards in the industry. In addition, since the portion of each contact 12 at the recess 16 is thinner than other portion of the contact 12, severing the contact strip 10 from the contacts 12 at the recess 16, is relatively easier and the contacts 12 are less likely to be damaged.

Figure 12:
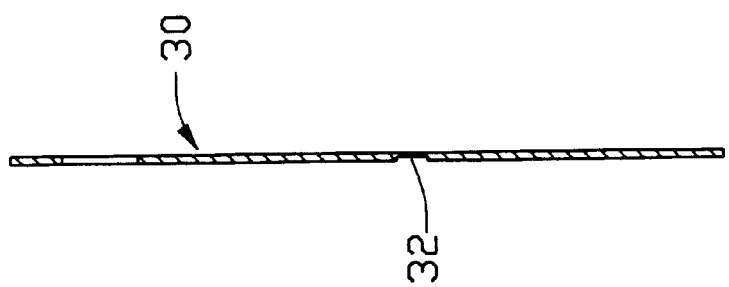
FIG. 12 is a cross-sectional view of the metal sheet of FIG. 11 taken along line XII—XII of FIG. 11.
Figure 11:
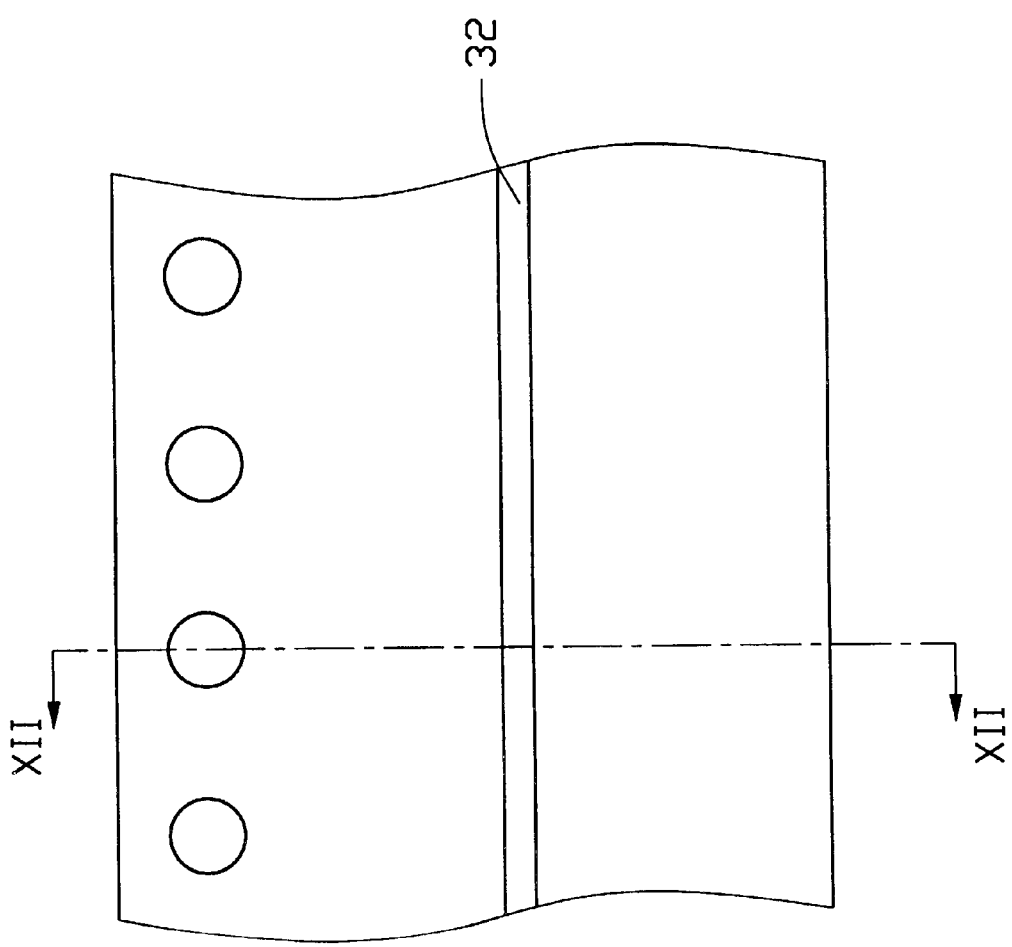
FIG. 11 is a top plan view of a metal sheet with a notch defined therein taken at a step of a second embodiment of the present invention.

Turning to FIGS. 11 & 12, in a second embodiment of the present invention, the steps a and b are interchanged. That is to say, a notch 32 is first defined in a metal sheet 30 when the metal sheet is fed into the stamping machine, before the forming of the contact strip 10 and the contacts 12 shown in FIGS. 3 & 4. The other steps are generally identical to those of the first embodiment.

In a third embodiment, the contacts 12 are retained in the housing 20 by insert-molding. The other steps are generally identical to those of the first or the second embodiments.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of making an electrical connector comprising steps of:

a. stamping a metal sheet to form a contact strip and a plurality of contacts on the contact strip, the contacts being arrayed in a row and being distanced from each other a predetermined distance;

b. defining a recess in a tail of each contact;

c. applying a finish on at least portions of the tails having the recesses for facilitating soldering the tails to circuit pads on a printed circuit board (PCB);

d. forming an insulative housing and engaging the contacts within the housing; and e. severing the contact strip from the contacts;

wherein, in step a, the contacts connect to the contact strip via the tails thereof;

wherein, in step c, a first finish of nickel material is applied on the portions having the recesses and is followed by a second finish of tin-lead alloy material;

wherein the solder tails are soldered to the circuit pads using soldering tin;

wherein, in step d, the housing defines a plurality of contact receiving cavities and the contacts are respectively inserted into corresponding cavities;

wherein the contacts are arranged in first and second rows and the recesses of the first row of contacts confront the recesses of the second row of contacts;

further including a step of bending the tails of the contacts to abut against a bottom surface of the housing after step d;

wherein, in step e, the contact strip is severed from the contacts at the recesses and the tails of the contacts retain the recesses.

* * * * *